(12) United States Patent
West et al.

(10) Patent No.: US 12,463,153 B2
(45) Date of Patent: Nov. 4, 2025

(54) SINGLE DIE REINFORCED GALVANIC ISOLATION DEVICE

(71) Applicant: Texas Instruments Incorporated, Dallas, TX (US)

(72) Inventors: Jeffrey Alan West, Dallas, TX (US); Thomas Dyer Bonifield, Dallas, TX (US); Toshiyuki Tamura, Ushiku (JP); Yoshihiro Takei, Kashiwa (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 347 days.

(21) Appl. No.: 17/958,040

(22) Filed: Sep. 30, 2022

(65) Prior Publication Data

US 2024/0113042 A1   Apr. 4, 2024

(51) Int. Cl.
  *H01L 23/58* (2006.01)
  *H01L 21/762* (2006.01)
  *H01L 23/00* (2006.01)
  *H01L 23/532* (2006.01)
  *H01L 23/544* (2006.01)

(52) U.S. Cl.
  CPC ......... *H01L 23/585* (2013.01); *H01L 21/762* (2013.01); *H01L 23/53295* (2013.01); *H01L 23/544* (2013.01); *H01L 24/06* (2013.01); *H01L 2223/54426* (2013.01); *H01L 2224/04042* (2013.01); *H01L 2224/06102* (2013.01)

(58) Field of Classification Search
  CPC . H10D 1/20; H01L 2223/54426; H01L 24/06; H01L 2224/04042; H01L 2224/06102; H01L 23/53295; H01L 23/544; H01L 23/645; H01L 21/762; H01L 23/64
  See application file for complete search history.

(56) References Cited

U.S. PATENT DOCUMENTS

| | | |
|---|---|---|
| 2017/0278841 A1 | 9/2017 | Palumbo |
| 2019/0206981 A1 | 7/2019 | Bonifield |
| 2020/0035617 A1 | 1/2020 | Stewart |
| 2020/0312794 A1* | 10/2020 | West ..................... H01L 23/645 |

OTHER PUBLICATIONS

International Search Report dated Jan. 19, 2024.

* cited by examiner

*Primary Examiner* — Julio J Maldonado
*Assistant Examiner* — Stanetta D Isaac
(74) *Attorney, Agent, or Firm* — Yudong Kim; Frank D. Cimino

(57) ABSTRACT

A microelectronic device including an isolation device. The isolation device includes a lower isolation element, an upper isolation element, and an inorganic dielectric plateau between the lower isolation element and the upper isolation element. The inorganic dielectric plateau contains an upper etch stop layer and a lower etch stop layer between the upper isolation element and the lower isolation element. The upper etch stop layer provides an end point signal during the plateau etch process which provides feedback on the amount of inorganic dielectric plateau which has been etched. The lower etch stop layer provides a traditional etch stop function to provide for a complete plateau etch and protection of an underlying metal bond pad. The inorganic dielectric plateau also contains alternating layers of high stress and low stress silicon dioxide, which provide a means of reinforcement of the inorganic dielectric plateau.

21 Claims, 18 Drawing Sheets

SINGLE DIE REINFORCED GALVANIC ISOLATION DEVICE

FIELD

This disclosure relates to the field of microelectronic devices. More particularly, but not exclusively, this disclosure relates to galvanic isolation devices in microelectronic devices.

BACKGROUND

Galvanic isolation is a principle of isolating functional sections of electrical systems to prevent current flow while energy or information can still be exchanged between sections by other means, such as capacitance, induction, electromagnetic waves, optical, acoustic, or mechanical means. Galvanic isolation is typically used where two or more electric circuits communicate, but their grounds or reference nodes may be at different potentials. It is an effective method of breaking ground loops by preventing unwanted current from flowing between two units sharing a reference conductor. Galvanic isolation is also used for safety as a means of preventing accidental current from reaching ground through a person's body.

Isolators are devices designed to minimize direct current and unwanted transient currents between two systems or circuits while allowing data and power transmission between the two. In most applications, isolators also act as a barrier to high voltage in addition to allowing the system to function properly. Where capacitive elements are used as isolators, dielectric breakdown is a key concern, especially in high-voltage applications.

As the advances in the design of integrated circuits and semiconductor fabrication continue to take place, improvements in microelectronic devices, including galvanic isolators are also being concomitantly pursued.

SUMMARY

The following presents a simplified summary in order to provide a basic understanding of one or more aspects of the present patent disclosure. The summary is not an extensive overview of the disclosure and is not intended to identify key or critical elements of the disclosure, nor is it to delineate the scope thereof. Rather, the primary purpose of the summary is to present some concepts of the disclosure in a simplified form as a prelude to a more detailed description that is present later.

Embodiments of a microelectronic device including a galvanic isolation device hereafter referred to as isolation device are disclosed. The isolation device includes a lower isolation element hereafter referred to as the lower metal coil, an upper isolation element hereafter referred to as the upper metal coil, and a reinforced galvanic isolation device inorganic dielectric stack hereafter referred to as the plateau between the lower metal coil and the upper metal coil. The plateau contains an upper etch stop layer and a lower etch stop layer between the upper and lower metal coils within the plateau. The upper etch stop layer provides an electrical signal during the plateau etch process which provides feedback on the amount of plateau which has been etched. The lower etch stop layer provides a traditional etch stop function to provide for a complete plateau etch, and protection of an underlying metal bond pad. The combination of the upper and lower bond pad is advantageous as it provides a means to form a very thick (greater than 10 microns) plateau between the upper metal coil and the lower metal coil. The plateau also contains alternating layers of high stress and low stress silicon dioxide. The alternating layers of high stress silicon dioxide and low stress silicon dioxide provide a means of reinforcement of the plateau which improves resistance to cracking of the plateau.

BRIEF DESCRIPTION OF THE VIEWS OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following detailed description taken in connection with the appended claims and with reference to the attached drawing Figures in which:

DETAILED DESCRIPTION

Figure 1A:
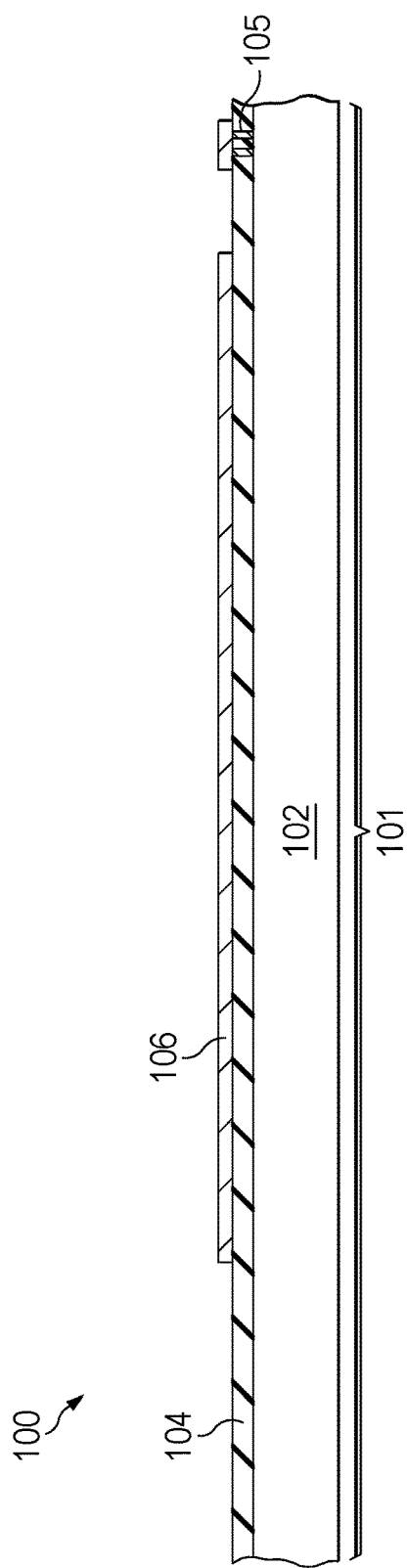
FIG. 1A through FIG. 1T are cross sections of an example microelectronic device with an isolation device, depicted in successive stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent applications have related subject matter and are hereby incorporated by reference: U.S. patent application Ser. No. 17/957,847 (titled "GALVANIC ISOLATION DEVICE", by West, et al.), and U.S. patent application Ser. No. 17/957,875, titled "FIELD SUPPRESSION FEATURE FOR GALVANIC ISOLATION DEVICE", by West, et al.), both filed simultaneously with this application. With their mention in this section, these patent applications are not admitted to be prior art with respect to the present invention.

The following co-pending patent applications have related subject matter and are hereby incorporated by reference: U.S. Provisional Patent Application No. 63/377,877, U.S. Provisional Patent Application No. 63/411,934, U.S. Provisional Patent Application No. 63/411,942, U.S. Provisional Patent Application No. 63/411,952, and U.S. Provisional Patent Application No. 63/411,961, all filed simultaneously with this application. With their mention in this section, these patent applications are not admitted to be prior art with respect to the present invention.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

Example microelectronic devices described below may include or be formed of a semiconductor material like Silicon (Si), Silicon Carbide (SiC), Silicon Germanium (SiGe), Gallium Arsenide (GaAs) or an organic semiconductor material. The semiconductor material may be embodied as a semiconductor wafer. The microelectronic devices include one or more galvanic isolation devices. The microelectronic devices may also include one or more semiconductor component or components such as metal oxide semiconductor field effect transistors (MOSFETs), insulated gate bipolar transistors (IGBTs) gate drivers, input/output and control circuitry, as well as microprocessors, microcontrollers, and/or micro-electro-mechanical components or systems (MEMS). The microelectronic devices may be manifested as single chip devices or may be contained in multi-chip modules (MCMs). The semiconductor chip may further include inorganic and/or organic materials that are not semiconductor, for example, insulators such as inorganic dielectric materials or polymers, or conductors such as metals.

For the purposes of this disclosure, the term "high voltage" refers to operating potentials greater than 450 volts, and "low voltage" refers to operating potentials less than 100 volts. For example, a high voltage portion of the isolation device may operate at 450 volts to 1200 volts, while a low voltage portion of the isolation device may operate at 1.5 volts to 30 volts.

It is noted that terms such as top, bottom, front, back, over, above, under, and below may be used in this disclosure. These terms should not be construed as limiting the position or orientation of a structure or element, but should be used to provide spatial relationship between structures or elements. Similarly, words such as "inward" and "outward" would refer to directions toward and away from, respectively, the geometric center of a device or area and designated parts thereof.

For the purposes of this disclosure, the term "lateral" refers to a direction parallel to a plane of the instant top surface of the microelectronic device the term "vertical" is understood to refer to a direction perpendicular to the plane of the instant top surface of the microelectronic device.

For the purposes of this disclosure, the term "conductive" is to be interpreted as "electrically conductive". The term "conductive" refers to materials and structures capable of supporting a steady electrical current, that is, direct current (DC).

For the purposes of this disclosure, the "dielectric constant" of a material refers to a ratio of the material's (absolute) permittivity to the vacuum permittivity, at a frequency below 1 hertz (Hz). The vacuum permittivity has a value of approximately $8.85 \times 10^{-12}$ farads/meter (F/m).

For the purposes of this disclosure, unless otherwise noted, the term high stress silicon dioxide refers to a silicon dioxide film with a stress of between −150 MPa and −80 MPa and the term low stress silicon dioxide refers to a silicon dioxide film with a stress of between −60 MPa and −10 MPa. Additionally, a negative stress implies a compressive stress and a positive stress implies a tensile stress.

FIG. 1A is a cross section of an example microelectronic device 100 with a portion of an isolation device 101 after the formation of first level interconnects 106. The microelectronic device 100 may be implemented as part of a multichip array to provide galvanic isolation between a high voltage component and a low voltage component. The isolation device 101 of this example is a transformer, but could include a capacitor, a magnetic isolator, an optical isolator, a thermal isolator, or other elements which require galvanic isolation between high voltage and low voltage elements. The microelectronic device 100 is formed on a substrate 102, which may be part of a semiconductor wafer and may contain additional microelectronic devices. The substrate 102 includes a semiconductor material. The semiconductor material may include crystalline silicon, or may include another semiconductor material, such as silicon germanium, silicon carbide, gallium nitride, or gallium arsenide, by way of example.

A pre-metal dielectric (PMD) layer 104 is formed over the substrate 102. The PMD layer 104 includes one or more dielectric layers of silicon dioxide, phosphosilicate glass (PSG), fluorosilicate glass (FSG), borophosphosilicate glass (BPSG), organosilicate glass (OSG), low-k dielectric material, silicon nitride, silicon oxynitride, silicon carbide, silicon carbide nitride, or other dielectric materials. The PMD layer 104 may be formed by one or more dielectric deposition processes, such as a low-pressure chemical vapor deposition (LPCVD) process, a plasma enhanced chemical vapor deposition (PECVD) process, a high aspect ratio process (HARP) using ozone and tetraethyl orthosilicate (TEOS), high density plasma deposition (HDP), or an atmospheric pressure chemical vapor deposition (APCVD) process.

Contacts 105 of the first level interconnects 106 are formed through the PMD layer 104 to make electrical connections to the substrate 102. The contacts 105 are electrically conductive, and may include tungsten on a titanium adhesion layer and a titanium nitride liner. The contacts 105 may be formed by etching contact holes through the PMD layer 104, and forming the titanium adhesion layer by a physical vapor deposition (PVD) process. The titanium nitride liner may be formed on the titanium adhesion layer by an atomic layer deposition (ALD) process or chemical vapor deposition (CVD) process. The tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the PMD layer 104, outside of the contacts 105, may be removed by a tungsten etch back process, a tungsten chemical mechanical polish (CMP) process, or both.

By way of example, the metallization of the isolation device 101 is described for an etched aluminum-based interconnect system. The isolation device 101 may also be formed using a copper-based interconnect system. First level interconnects 106 are formed on the PMD layer 104, making electrical connections to the contacts 105. The first level interconnects 106 are electrically conductive. The first level interconnects 106 may have an etched aluminum structure, and may include an adhesion layer, not shown, of titanium nitride or titanium tungsten, on the PMD layer 104, an aluminum layer, not specifically shown, with a few atomic percent of silicon, titanium, or copper, on the adhesion layer, and an anti-reflection layer, not specifically shown, of titanium nitride on the aluminum layer. An etch mask, not specifically shown, is formed followed by a reactive ion etch (RIE) process to etch the anti-reflection layer, the aluminum layer, and the adhesion layer where exposed by the etch mask, and subsequently removing the etch mask to form the first level interconnects 106.

Figure 1B:
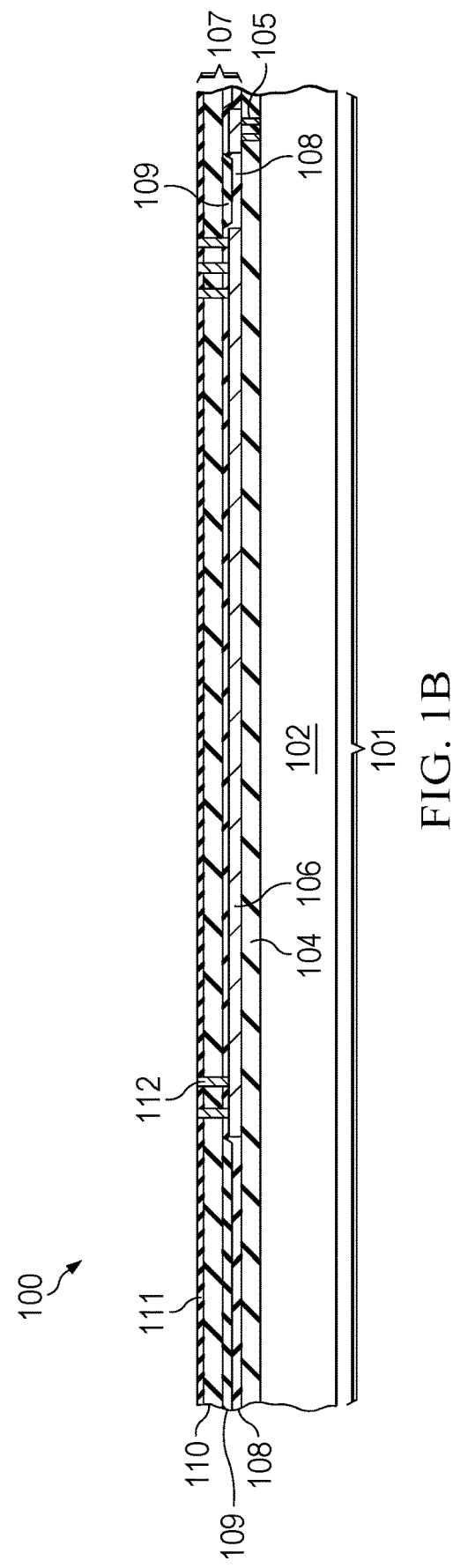
Figure 1C:
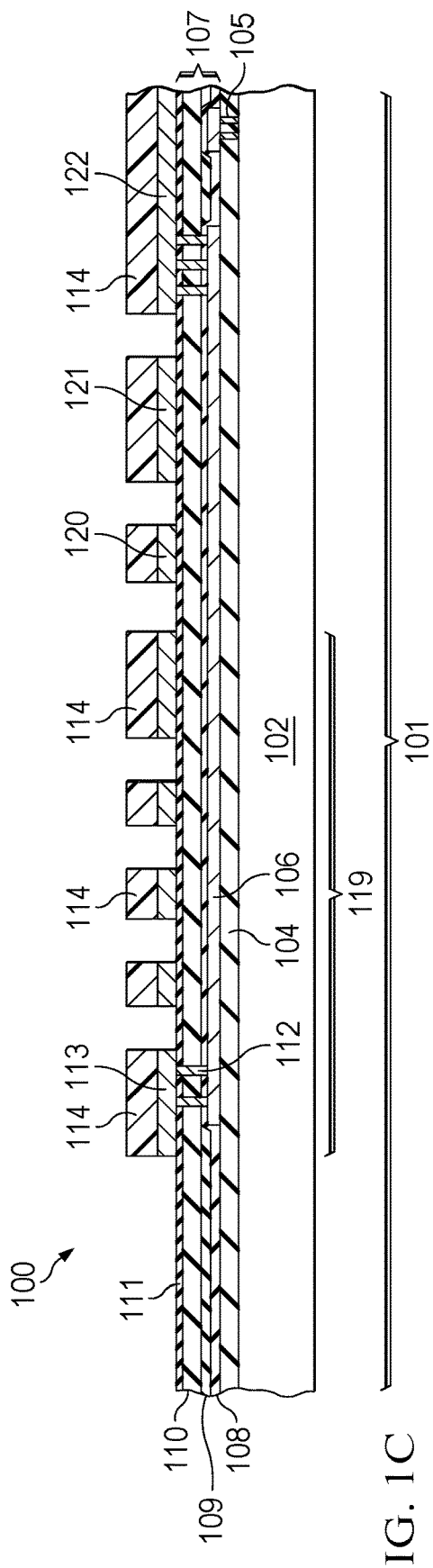
Figure 1D:
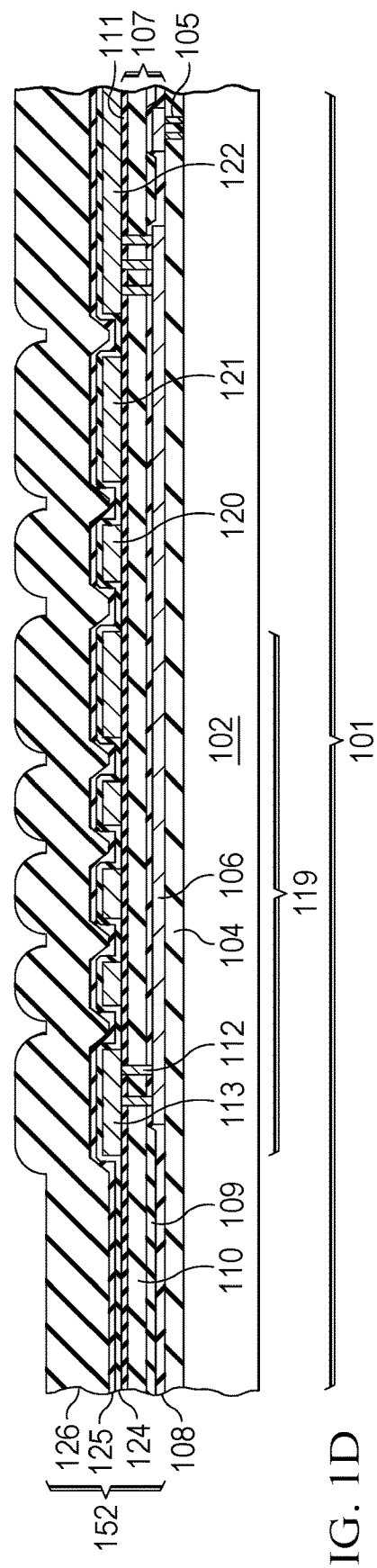

Referring to FIG. 1B through FIG. 1D, a lower dielectric stack 123 is formed which may include multiple dielectric layers and a second level interconnects layer 113. The lower dielectric stack 123 formation begins after the formation of the first level interconnects 106, with a first inter-level dielectric (ILD) layer 107 formed on the first level interconnects 106. The first ILD layer 107 may include a multiple layer silicon dioxide-based dielectric stack. The multiple layer silicon dioxide-based dielectric stack is formed by depositing a first gap fill silicon dioxide layer 108 of between 400 nm and 800 nm on the first level interconnects 106 and exposed PMD layer 104. A first high stress silicon dioxide layer 109 is formed on the first gap fill silicon dioxide layer 108 with a thickness of between 1000 nm to 1500 nm which is planarized by a chemical mechanical planarization (CMP) step (not specifically shown) to leave a stack of between 600 nm and 800 nm of the first gap fill silicon dioxide layer 108 and first high stress silicon dioxide layer 109 over the first level interconnects 106. After the CMP step (not specifically shown), between 2000 and 2500 nm of a first low stress silicon dioxide layer 110 is deposited by a PECVD or CVD process on the CMP planarized first high stress silicon dioxide layer 109. A second high stress silicon dioxide layer 111 of between 200 nm and 500 nm in thickness is then deposited on the first low stress silicon dioxide layer 110 to complete the first ILD layer 107.

After the formation of the first ILD layer 107, first level vias 112 are formed in the first ILD layer 107, making electrical connection to the first level interconnects 106. The first level vias 112 may be formed by etching via holes through the first ILD layer 107, and forming a titanium adhesion layer by a physical vapor deposition (PVD) process. A titanium nitride liner may be formed on the titanium adhesion layer by an atomic layer deposition (ALD) process or chemical vapor deposition (CVD) process. Tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the first level vias 112, outside of the via holes may be removed by a tungsten etch back process, a tungsten chemical mechanical polish (CMP) process, or both.

Referring to FIG. 1C, second level interconnects 113 are formed on the first ILD layer 107 making electrical contact with the first level vias 112. The second level interconnects 113 are electrically conductive. The second level interconnects 113 may have an etched aluminum structure, and may include an adhesion layer, not specifically shown, of titanium nitride or titanium tungsten, on the first ILD layer 107, an aluminum layer, not specifically shown, with a few atomic percent of silicon, titanium, or copper, on the adhesion layer, and an anti-reflection layer, not specifically shown, of titanium nitride on the aluminum layer. A second interconnects etch mask 114, is formed followed by a reactive ion etch (RIE) process to etch the anti-reflection layer, the aluminum layer, and the adhesion layer where exposed by the etch mask, and subsequently removing the etch mask to form the second level interconnects 113. In this example, a lower metal coil 119 of the isolation device 101 may be formed in the second level interconnects 113 but may be formed at other levels. A ground ring 120 (grounding outside of the plane of the cross section of FIG. 1C) for the isolation device 101 is also formed in the second level interconnects 113. Grounded second level interconnects filler metal 121 (grounding outside of the plane of the cross section of FIG. 1C) may also be formed in the second level interconnects. A lower bond pad 122 may also be formed in the second level interconnects 113.

Figure 1E:
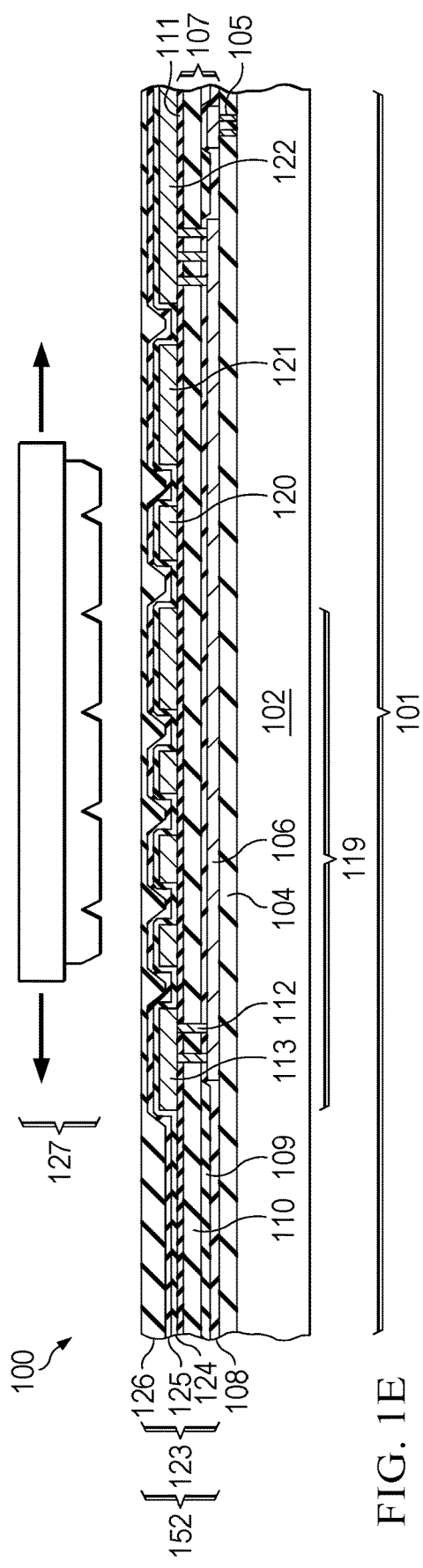
Figure 1F:
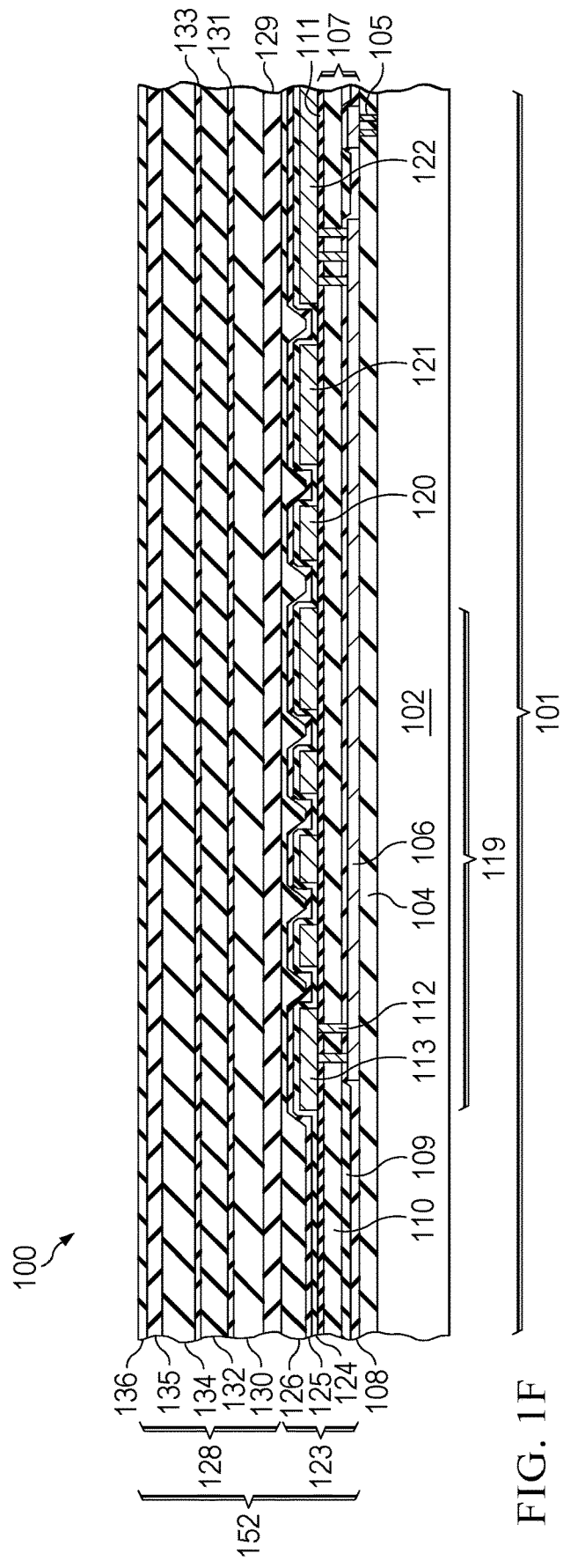
Figure 1G:
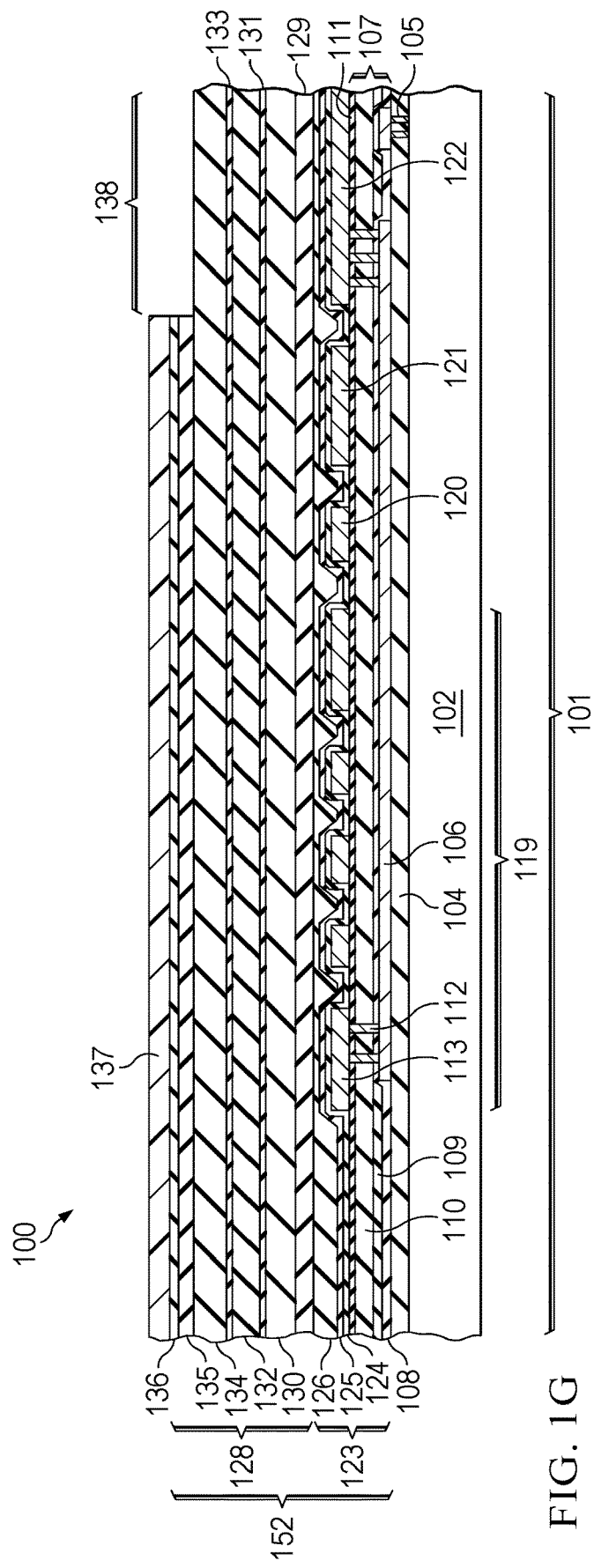
Figure 1H:
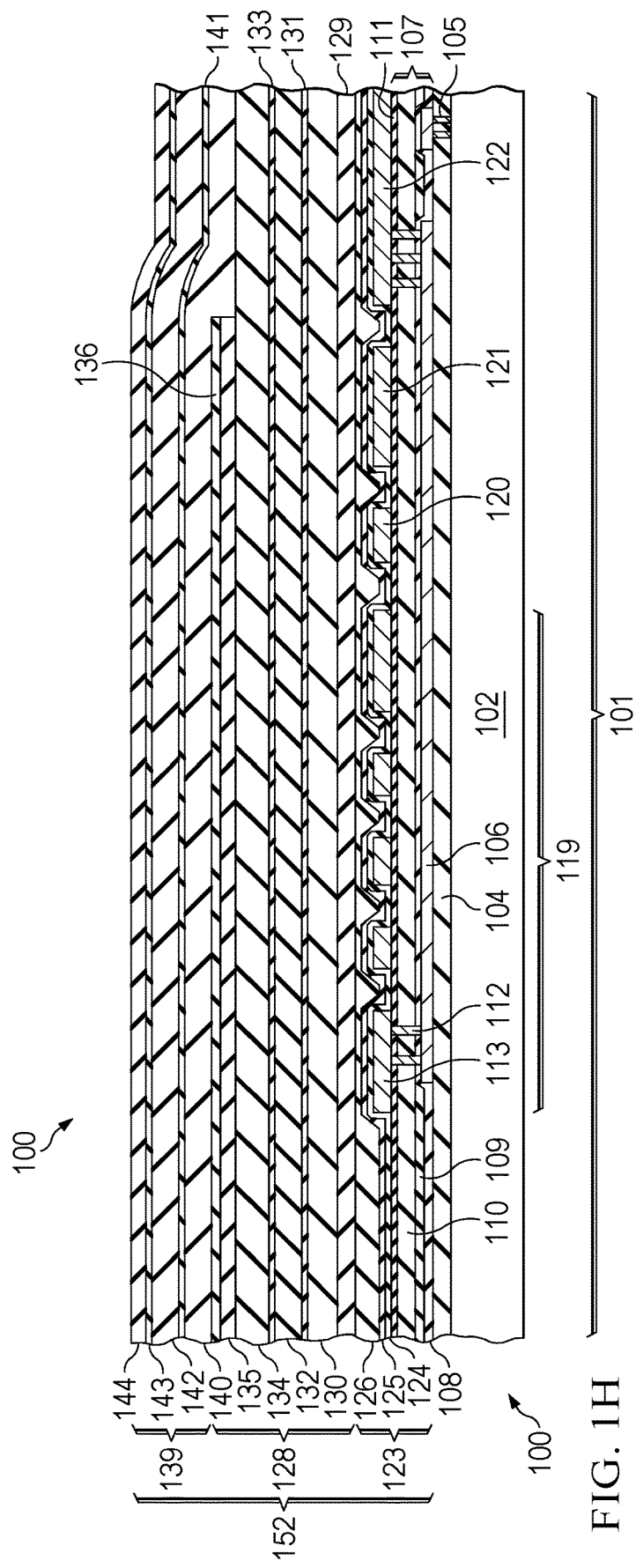
Figure 1I:
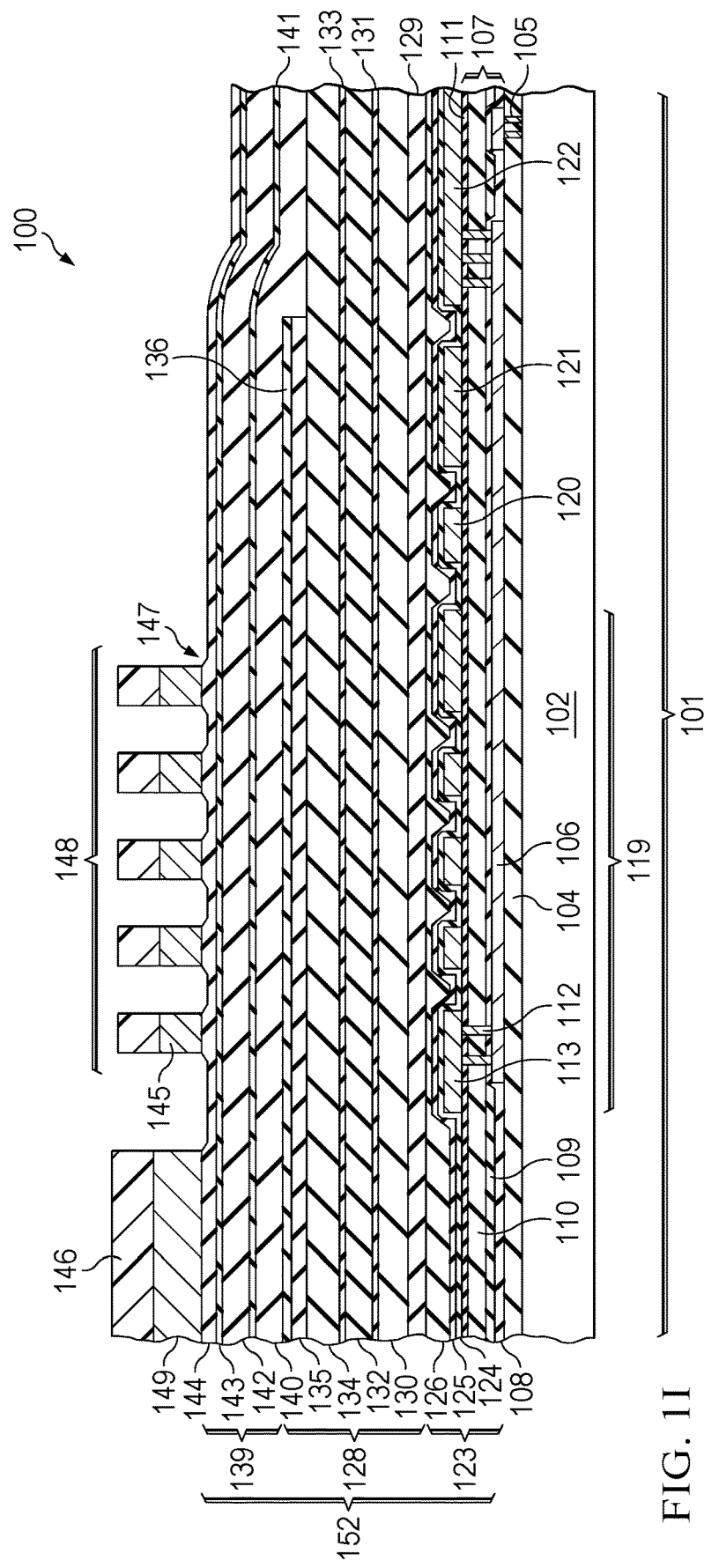

In FIG. 1D through FIG. 1H, a series of dielectric layers are deposited which form the plateau 152 of the isolation device 101 between the lower metal coil 119 shown in FIG. 1C and the upper metal coil 148 shown in FIG. 1I. Referring to FIG. 1D, a silicon nitride/silicon oxynitride bilayer 124 is formed over the second level interconnects 113. The silicon nitride/silicon oxynitride bilayer 124 may include a silicon nitride layer and a silicon oxynitride layer. The silicon nitride layer is between 100 nm and 600 nm in thickness with a stress of −1 GPa to −100 MPa. The silicon oxynitride layer is between 300 nm and 1000 nm with a stress between −150 MPa to 0 MPa. A second gap fill silicon dioxide layer 125 (in this example HDP oxide) is formed on the silicon nitride/silicon oxynitride bilayer 124. The second gap fill silicon dioxide layer 125 is deposited with a thickness between 1000 nm and 1800 nm.

Referring to FIG. 1E a second low stress silicon dioxide layer 126 is formed on the second gap fill silicon dioxide layer 125. The second low stress silicon dioxide layer 126 is deposited with a thickness between 2000 nm and 3000 nm. After the deposition of the second low stress silicon dioxide layer 126, a CMP process 127 is used to planarize the second low stress silicon dioxide layer 126.

Referring to FIG. 1F, a middle dielectric stack 128 including multiple dielectric films is deposited. To form the middle dielectric stack 128 a lower etch stop layer herein referred to as a first silicon oxynitride etch stop layer 129 is deposited on the second low stress silicon dioxide layer 126. The first silicon oxynitride etch stop layer 129 is deposited by a CVD or PECVD process and is between 500 nm to 1500 nm in thickness with a stress between −120 MPa and 0 MPa. A third low stress silicon dioxide layer 130 is deposited on the first silicon oxynitride etch stop layer 129. The third low stress silicon dioxide layer 130 is deposited by a CVD or PECVD process and is 2000 nm to 4000 nm in thickness. A third high stress silicon dioxide layer 131 is deposited on the third low stress silicon dioxide layer 130. The third high stress silicon dioxide layer 131 is deposited by a CVD or PECVD process and is 100 nm to 400 nm. A fourth low stress silicon dioxide layer 132 is deposited on the third high stress silicon dioxide layer 131. The fourth low stress silicon dioxide layer 132 is deposited by a CVD or PECVD process and is 2000 nm to 4000 nm in thickness. A fourth high stress silicon dioxide layer 133 is deposited on the fourth low stress silicon dioxide layer 132. The fourth high stress silicon dioxide layer 133 is deposited by a CVD or PECVD process and is 100 nm to 400 nm in thickness. A fifth low stress silicon dioxide layer 134 is deposited on the fourth high stress silicon dioxide layer 133. The fifth low stress silicon dioxide layer 134 is deposited by a CVD or PECVD process and is 2000 nm to 4000 nm in thickness. A fifth high stress silicon dioxide layer 135 is deposited on the fifth low stress silicon dioxide layer 134. The fifth high stress silicon dioxide layer 135 is deposited by a CVD or PECVD process and is 100 nm to 400 nm in thickness. An upper etch stop layer herein referred to as a second silicon oxynitride etch stop layer 136 is deposited on the fifth high stress silicon dioxide layer 135. The second silicon oxynitride etch stop layer 136 is deposited by a CVD or PECVD process and is between 100 nm to 400 nm in thickness with a stress between −120 MPa and 0 MPA.

Referring to FIG. 1G, an upper dielectric alignment photolithography layer 137 is patterned and exposed to provide an upper dielectric alignment photolithography opening 138 in the etch mask to produce an alignment mark (not specifically shown) to allow alignment of top metal interconnects 145 of the example transformer to the second level interconnects 113. A reactive ion etch is used to remove the second silicon oxynitride etch stop layer 136, and the fifth high stress silicon dioxide layer 135 in the open area. A portion of the fifth low stress silicon dioxide layer 134 in the upper dielectric alignment photolithography opening 138 may also be removed by the RIE process. It is advantageous to provide an alignment mark near the top of the plateau to facilitate acceptable alignment of an upper metal coil 148 to the lower metal coil 119.

Referring to FIG. 1H, a series of dielectric depositions forms an upper dielectric stack 139. The formation of the upper dielectric stack 139 begins with the formation of a sixth low stress silicon dioxide layer 140 on second silicon oxynitride etch stop layer 136, and on the fifth low stress silicon dioxide layer 134 in the upper dielectric alignment photolithography opening 138. The sixth low stress silicon dioxide layer 140 is deposited by a CVD or PECVD process and is 2000 nm to 3000 nm in thickness. After the formation of the sixth low stress silicon dioxide layer 140, a sixth high stress silicon dioxide layer 141 is formed on the sixth low stress silicon dioxide layer 140. The sixth high stress silicon dioxide layer 141 is formed by a CVD or PECVD process and is 100 nm to 400 nm in thickness. After formation of the sixth high stress silicon dioxide layer 141, a seventh low stress silicon dioxide layer 142 is formed on the sixth high stress silicon dioxide layer 141. The seventh low stress silicon dioxide layer 142 is deposited by a CVD or PECVD process and is 2000 nm to 4000 nm in thickness. After the formation of the seventh low stress silicon dioxide layer 142, an upper dielectric stack silicon oxynitride 143 is formed on the seventh low stress silicon dioxide layer 142. The upper dielectric stack silicon oxynitride 143 may be formed by a PECVD process using a combination of BTBAS and TEOS, or a combination of dichlorosilane and nitrous oxide, for example. The upper dielectric stack silicon oxynitride 143 may have a thickness between 100 nm and 400 nm, and a stress between -120 MPa and 0 MPa. Following the formation of the upper dielectric stack silicon oxynitride 143, an upper dielectric stack silicon nitride 144 is formed on the upper dielectric stack silicon oxynitride 143. The upper dielectric stack silicon nitride 144 is deposited by a CVD or PECVD process and is 200 nm to 1200 nm in thickness with a stress between-1 GPa and −100 MPA. The upper metal stack must contain at least one layer of low stress silicon dioxide, at least one layer of high stress silicon dioxide, at least one layer of silicon oxynitride, and at least one layer of silicon nitride.

Referring to FIG. 1I, top metal interconnects 145 are formed on the upper dielectric stack silicon nitride 144. The top metal interconnects 145 may have an etched aluminum structure, and may include an adhesion layer, not specifically shown, of titanium nitride or titanium tungsten, on the upper dielectric stack silicon nitride 144, an aluminum layer, not specifically shown, with a few atomic percent of silicon, titanium, or copper, on the adhesion layer, and an anti-reflection layer, not specifically shown, of titanium nitride on the aluminum layer. A top metal interconnects photolithography mask 146, is formed followed by a reactive ion etch (RIE) process to etch the anti-reflection layer, the aluminum layer, and the adhesion layer where exposed by the etch mask. The RIE process leaves a recess 147 into underlying upper dielectric stack silicon nitride 144. The cross section of FIG. 1H is shown before the removal of the top metal interconnects photolithography mask 146. The RIE used to etch the top metal interconnects may remove up to 200 nm of the underlying upper dielectric stack silicon nitride 144 in areas exposed to the RIE. Features of the top metal interconnects 145 shown in FIG. 1H include the upper metal coil 148 and the upper bond pad 149.

Figure 1J:
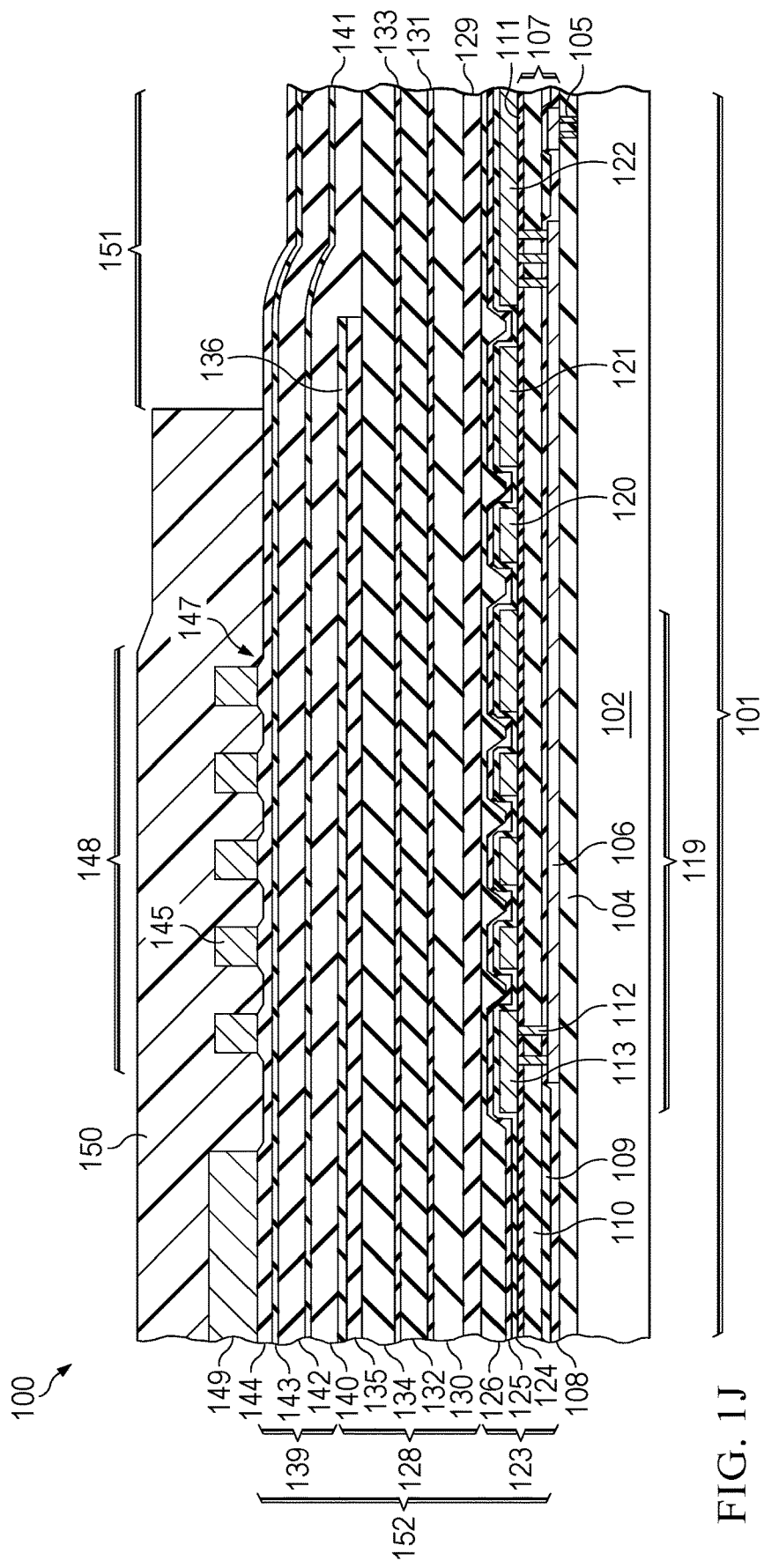

Referring to FIG. 1J, a layer of photoresist is patterned and exposed to leave a SOR photolithography mask 150 (greater than 5 μm in thickness) covering the upper bond pad 149 and the upper metal coil 148 and with a SOR photolithography mask opening 151 which allows removal of the upper dielectric stack silicon oxynitride 143, an upper dielectric stack silicon nitride 144 and a portion of the seventh low stress silicon dioxide layer 142 over the lower bond pad 122.

Figure 1K:
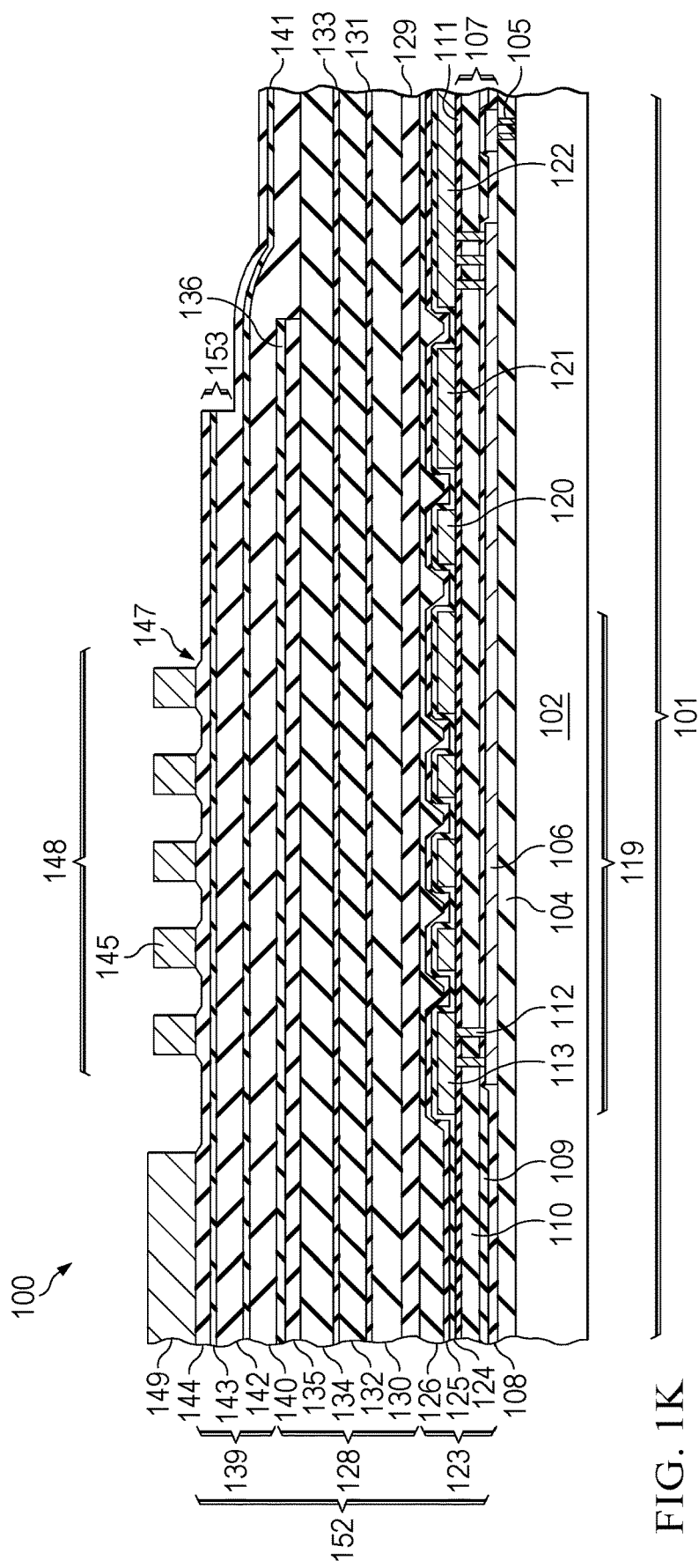

Referring to FIG. 1K, a cross section is shown after the first lower bond pad opening etch step (not specifically shown) which removes the upper dielectric stack silicon nitride 144, the upper dielectric stack silicon oxynitride 143, and the seventh low stress silicon dioxide layer 142 with a seventh low stress silicon dioxide layer etch removal 153 of between one and two microns in the SOR photolithography mask opening 151 region.

Figure 1L:
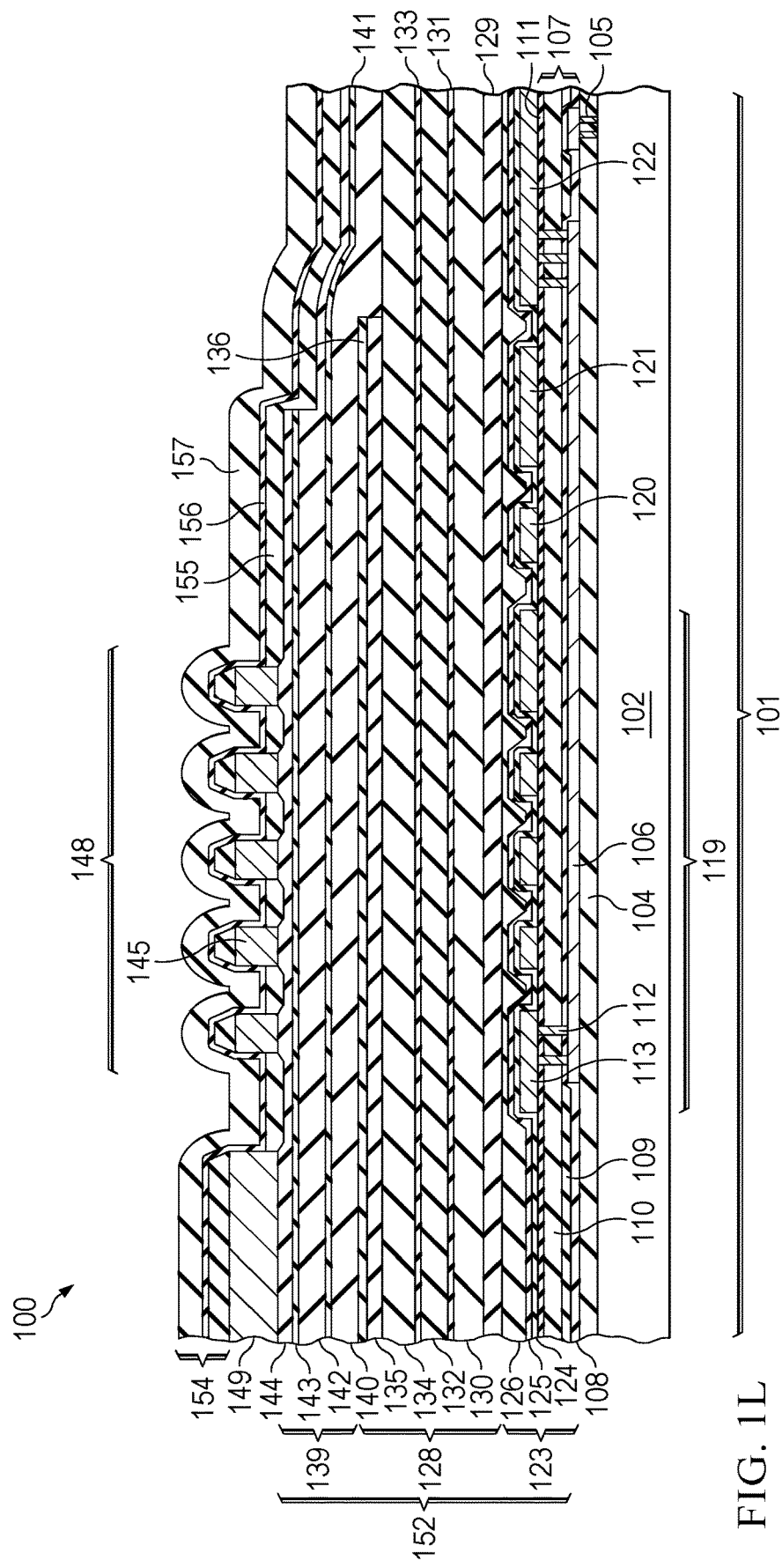

Referring to FIG. 1L, a protective overcoat (PO) inorganic dielectric stack 154 is formed over the top metal interconnects 145, exposed upper dielectric stack silicon nitride 144, and exposed seventh low stress silicon dioxide layer 142. The PO inorganic dielectric stack 154 may include a PO silicon dioxide layer 155 (HDP oxide in this example) formed over the top metal interconnects 145, upper dielectric stack silicon nitride 144, the upper dielectric stack silicon oxynitride 143, and seventh low stress silicon dioxide layer 142. The PO silicon dioxide layer 155 is between 1000 nm and 1500 nm in thickness with a stress between −120 MPa and −90 MPa. After the formation of the PO silicon dioxide layer 155, a PO high stress silicon dioxide layer 156 is formed on the PO silicon dioxide layer 155. The PO high stress silicon dioxide layer 156 is formed by a CVD or PECVD process and is 100 nm to 400 nm in thickness with a stress between −150 MPa and −80 MPa. After the formation of the PO high stress silicon dioxide layer 156, a PO silicon oxynitride layer 157 is formed on the PO high stress silicon dioxide layer 156. The PO silicon oxynitride layer 157 is deposited using a PECVD deposition and is 600 nm to 2400 nm in thickness with a stress between −120 MPa and 0 MPa. The PO silicon dioxide layer 155, the PO high stress silicon dioxide layer 156, and the PO silicon oxynitride layer 157 form the PO inorganic dielectric stack 154.

Figure 1M:
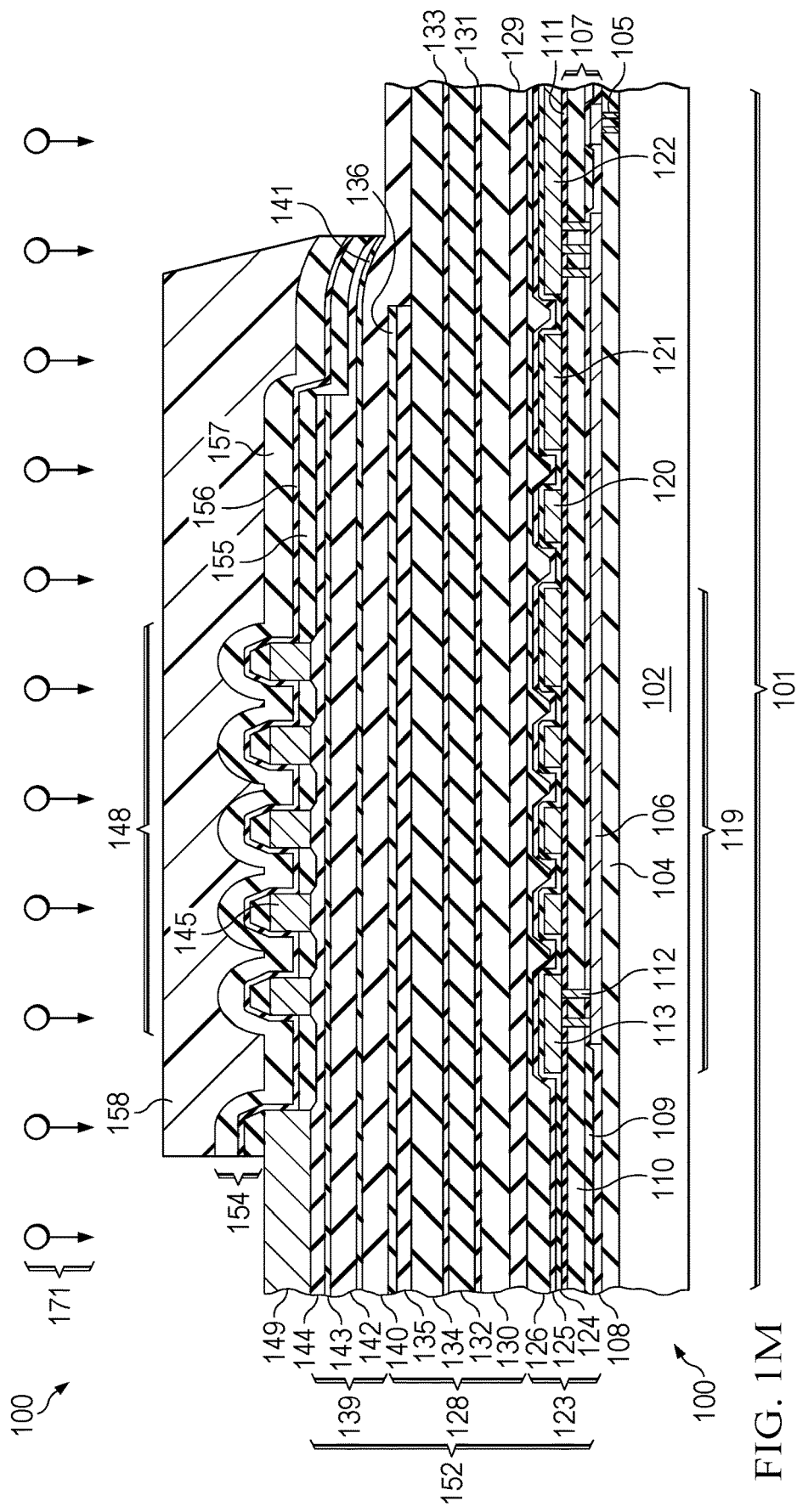

Referring to FIG. 1M, a PO photolithographic pattern 158 and a PO etch step 171 are used to remove the PO inorganic dielectric stack 154 in the regions over the upper bond pad 149 and the lower bond pad 122. In the region of the upper bond pad 149, the PO inorganic dielectric stack 154 is fully removed and the upper bond pad 149 is exposed. In the region over the lower bond pad 122 the PO inorganic dielectric stack 154 is fully removed as well as the seventh low stress silicon dioxide layer 142 and sixth high stress silicon dioxide layer 141.

Figure 1N:
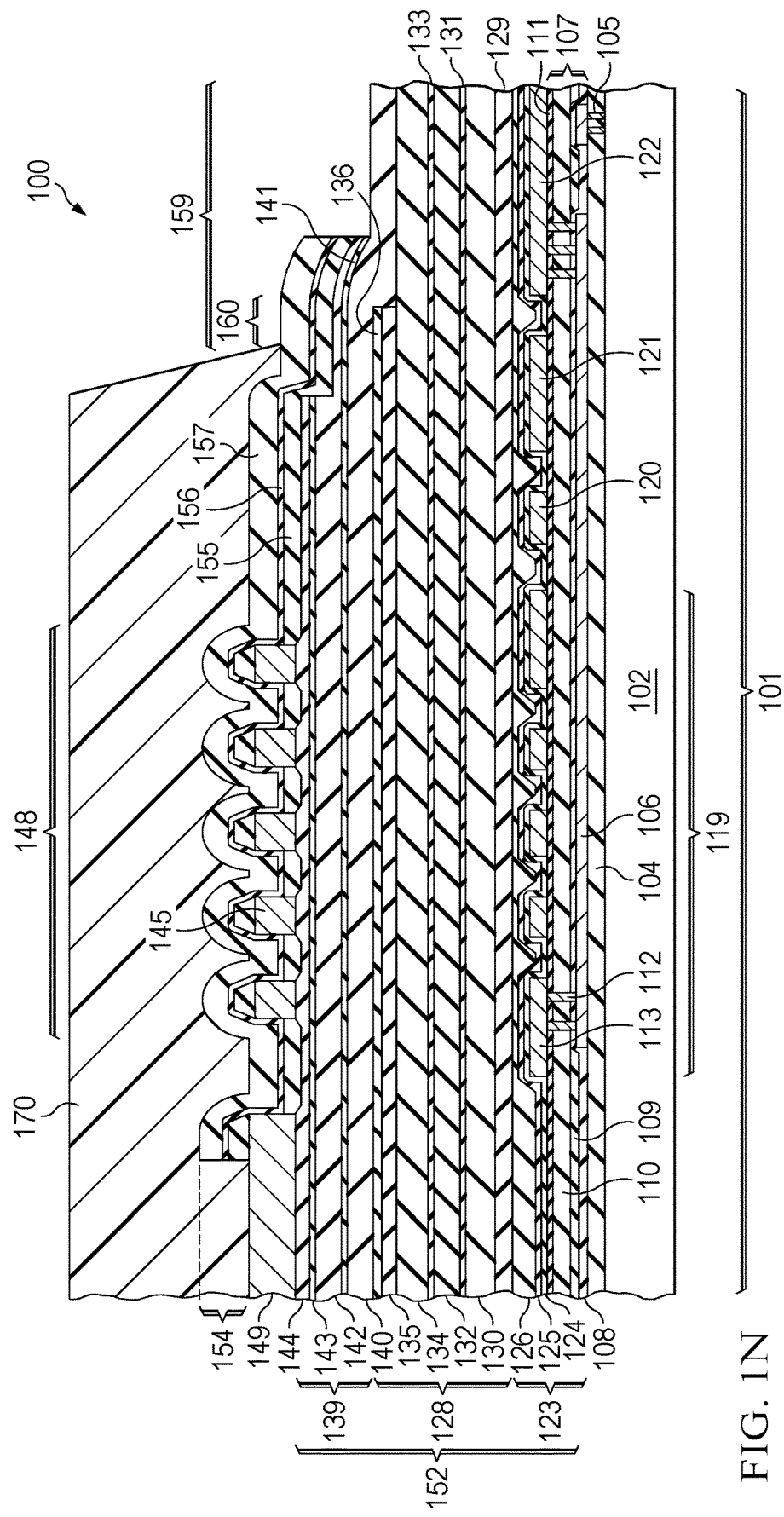

Referring to FIG. 1N a plateau photolithography mask 170 is formed. The plateau photolithography mask exposed area 159 includes both the region over the lower bond pad 122 and an exposed region 160 that extends beyond the over a portion of the first silicon oxynitride etch stop layer 129.

Figure 1O:
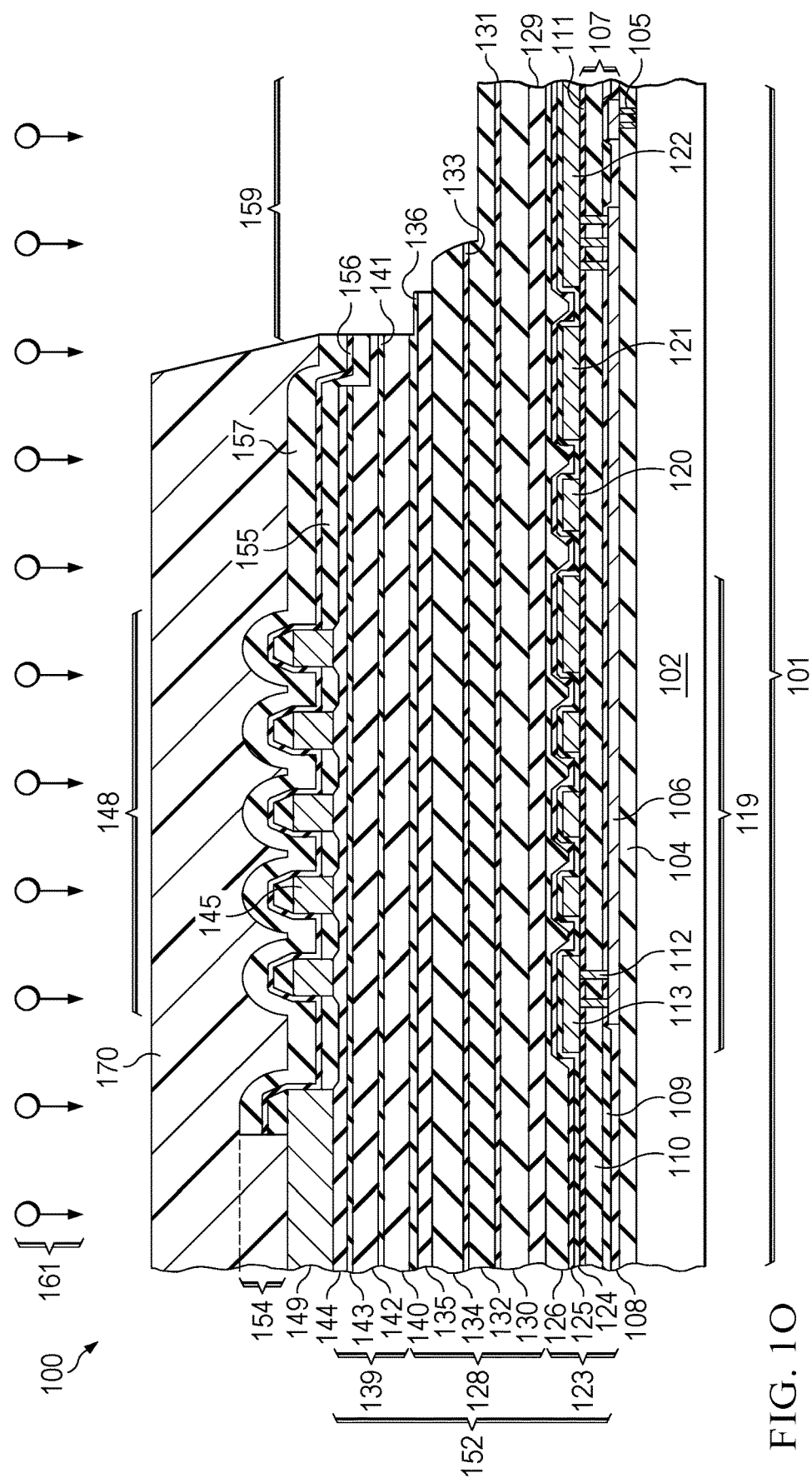
Figure 1P:
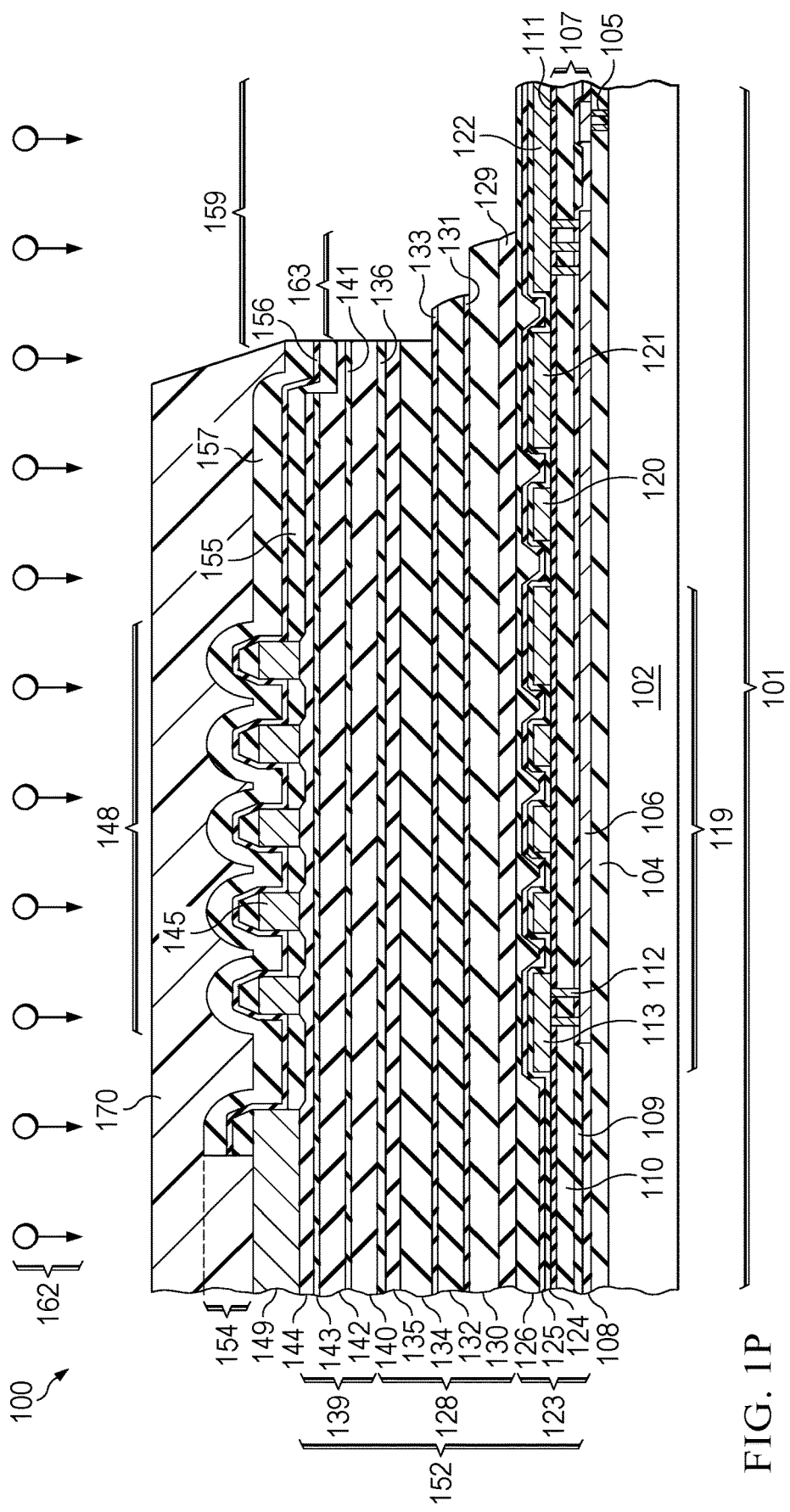
Figure 1Q:
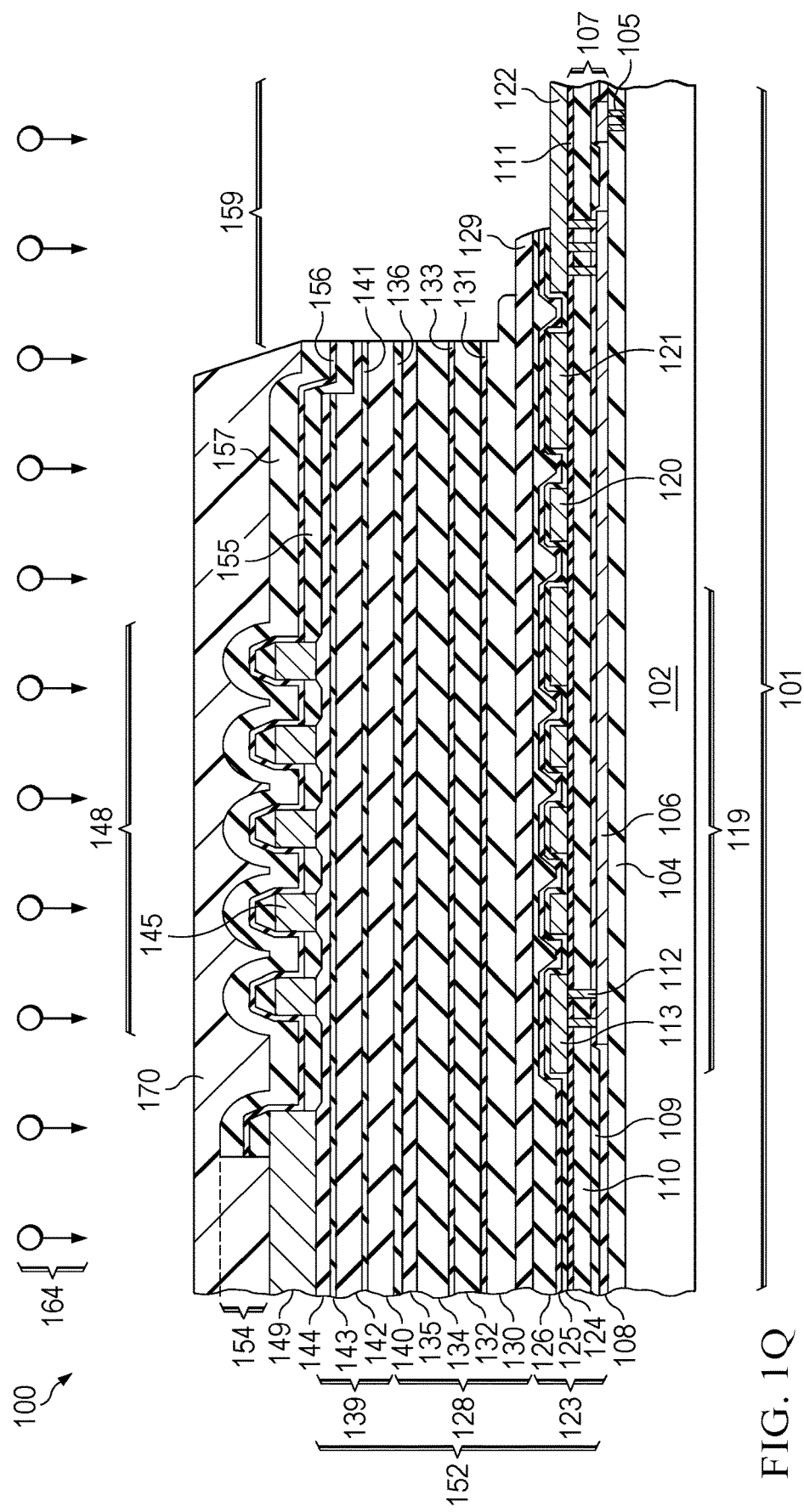

Referring to FIG. 1O to FIG. 1Q, the RIE etch process to expose the lower bond pad 122 is continuous, but is of multiple steps with varying fluorine based etch chemistry. For clarity of the etch profile during the etch process, the RIE etch process is discussed in terms of a first plateau RIE etch sub-process 161, a second plateau RIE etch sub-process 162, and a third plateau RIE etch sub-process 164.

Referring to FIG. 1O, the first plateau RIE etch sub-process 161 etches a portion of the plateau 152 in the plateau photolithography mask exposed area 159 over the lower bond pad 122. The first plateau RIE etch sub-process 161 etches through multiple dielectric layers until the first plateau RIE etch sub-process 161 reaches the second silicon oxynitride etch stop layer 136.

In the region over the grounded second level interconnects filler metal 121, the first plateau RIE etch sub-process 161 is stopped by the second silicon oxynitride etch stop layer 136. In the region over the lower bond pad 122, the first plateau RIE etch sub-process 161 etches into the fourth low stress silicon dioxide layer 132. It is advantageous to expose the second silicon oxynitride etch stop layer 136 as a means to provide an end point signal for the first plateau RIE etch sub-process 161. The first plateau RIE etch sub-process 161 consumes approximately 33% of the available resist thickness.

Referring to FIG. 1P, the second plateau RIE etch sub-process 162 etches through the middle dielectric stack 128 over the lower bond pad 122. The second plateau RIE etch sub-process 162 etches through the first silicon oxynitride etch stop layer 129 and ends in the second low stress silicon dioxide layer 126. The interaction between the PO etch step 171, the second silicon oxynitride etch stop layer 136, the first plateau RIE etch sub-process 161, and the second plateau RIE etch sub-process 162 with the plateau 152 leads to an oxide foot space 163 between the plateau photolithography mask 170 edge nearest the lower bond pad 122 and the lower bond pad 122.

Referring to FIG. 1Q, the third plateau RIE etch sub-process 164 is used to remove the second low stress silicon dioxide layer 126 which is remaining, the second gap fill silicon dioxide layer 125, and the silicon nitride/silicon oxynitride bilayer 124 over the lower bond pad 122. After the third plateau RIE etch sub-process 164 is complete, the plateau photolithography mask 170 remaining is removed. The first plateau RIE etch sub-process 161, the second plateau RIE etch sub-process 162, and the third plateau RIE etch sub-process 164 may be performed sequentially without an air break.

The first plateau RIE etch sub-process 161, the second plateau RIE etch sub-process 162, and the third plateau RIE etch sub-process 164 all use a fluorine based etch chemistry which also contains carbon and oxygen. The fluorine based etch chemistry may include least one alternation between an etch chemistry with a first carbon to oxygen ratio, and an etch chemistry with a second carbon to oxygen ratio greater than the first carbon to oxygen ratio during the sum processing of the first plateau RIE etch sub-process 161, the second plateau RIE etch sub-process 162, and the third plateau RIE etch sub-process 164. The first carbon to oxygen ratio may advantageously be used to etch to prevent a retrograde profile. Furthermore, the fluorine based etch chemistry may alternate between an atomic carbon to atomic oxygen ratio of less than 2 to an atomic carbon to an atomic oxygen ratio of greater than 2 at least once during the sum processing of the first plateau RIE etch sub-process 161, the second plateau RIE etch sub-process 162, and the third plateau RIE etch sub-process 164. For example, the carbon source may alternate between $C_5F_8$ and $C_4F_8$ with a constant $O_2$ flow (e.g., $C_5F_8$, $O_2$, and Ar at approximately 16/18/800 standard cubic centimeters per minute (sccm) alternated with $C_4F_8$, $O_2$, and Ar at approximately 16/18/800 sccm). A carbon to oxygen ratio greater than the second carbon to oxygen ratio may be used in the fluorine based etch chemistry if a silicon nitride/silicon oxynitride bilayer 124 is present. An atomic carbon to atomic oxygen ratio of greater than 3 may be used in the fluorine based etch chemistry if a silicon nitride/silicon oxynitride bilayer 124 is present.

Figure 1R:
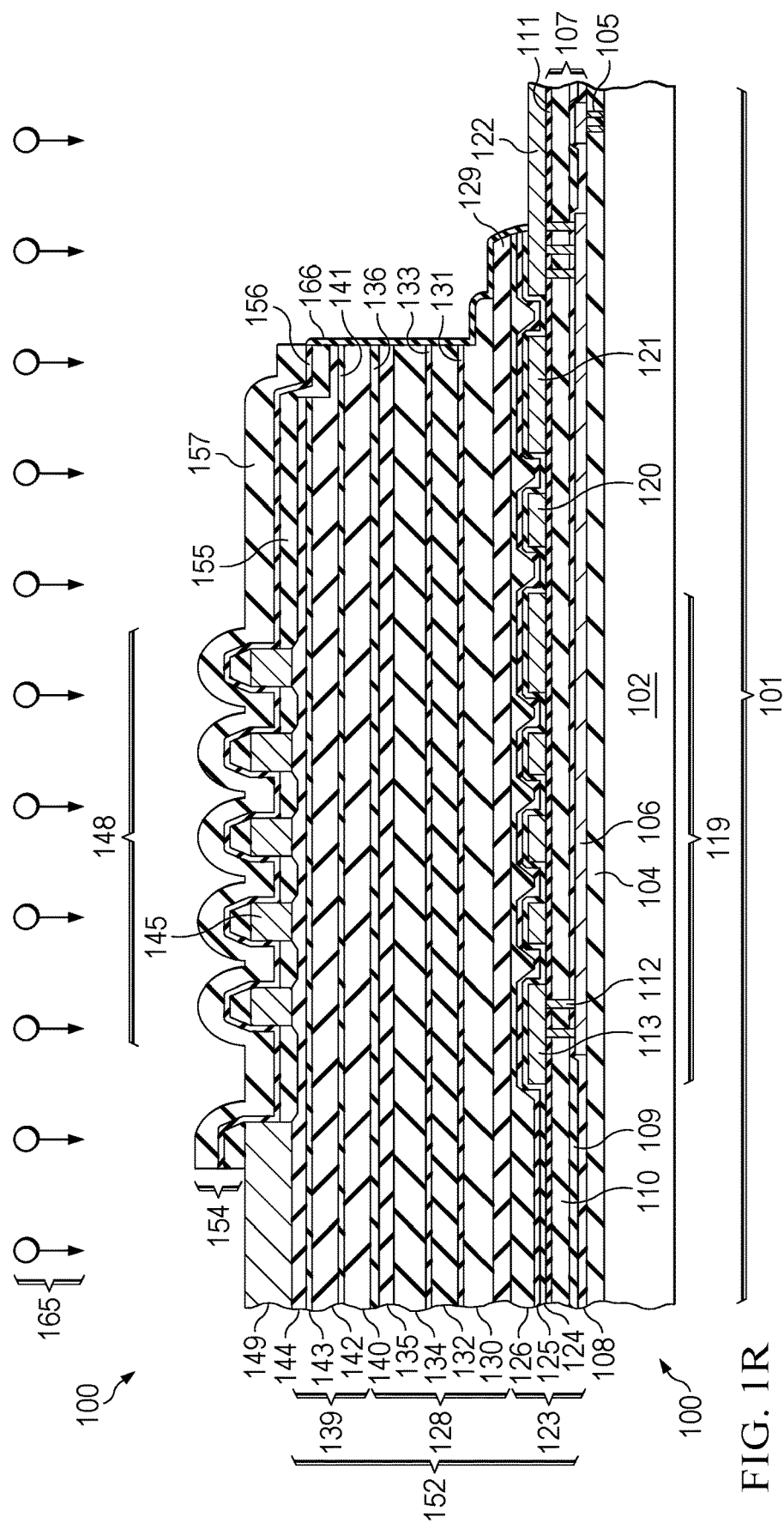

Referring to FIG. 1R, the cross section depicts the microelectronic device 100 after the plateau photolithography mask 170 is removed and after an ammonia plasma 165 process. The ammonia plasma 165 forms a $SiO_xN_y$ layer 166 on the exposed silicon dioxide surfaces of the lower dielectric stack 123, the middle dielectric stack 128, and the upper dielectric stack 139. It is advantageous to form the $SiO_xN_y$ layer 166 on the exposed areas of the lower dielectric stack 123, the middle dielectric stack 128, and the upper dielectric stack 139 to minimized moisture uptake which may negatively affect the dielectric integrity and high voltage performance of the isolation device 101.

Figure 1S:
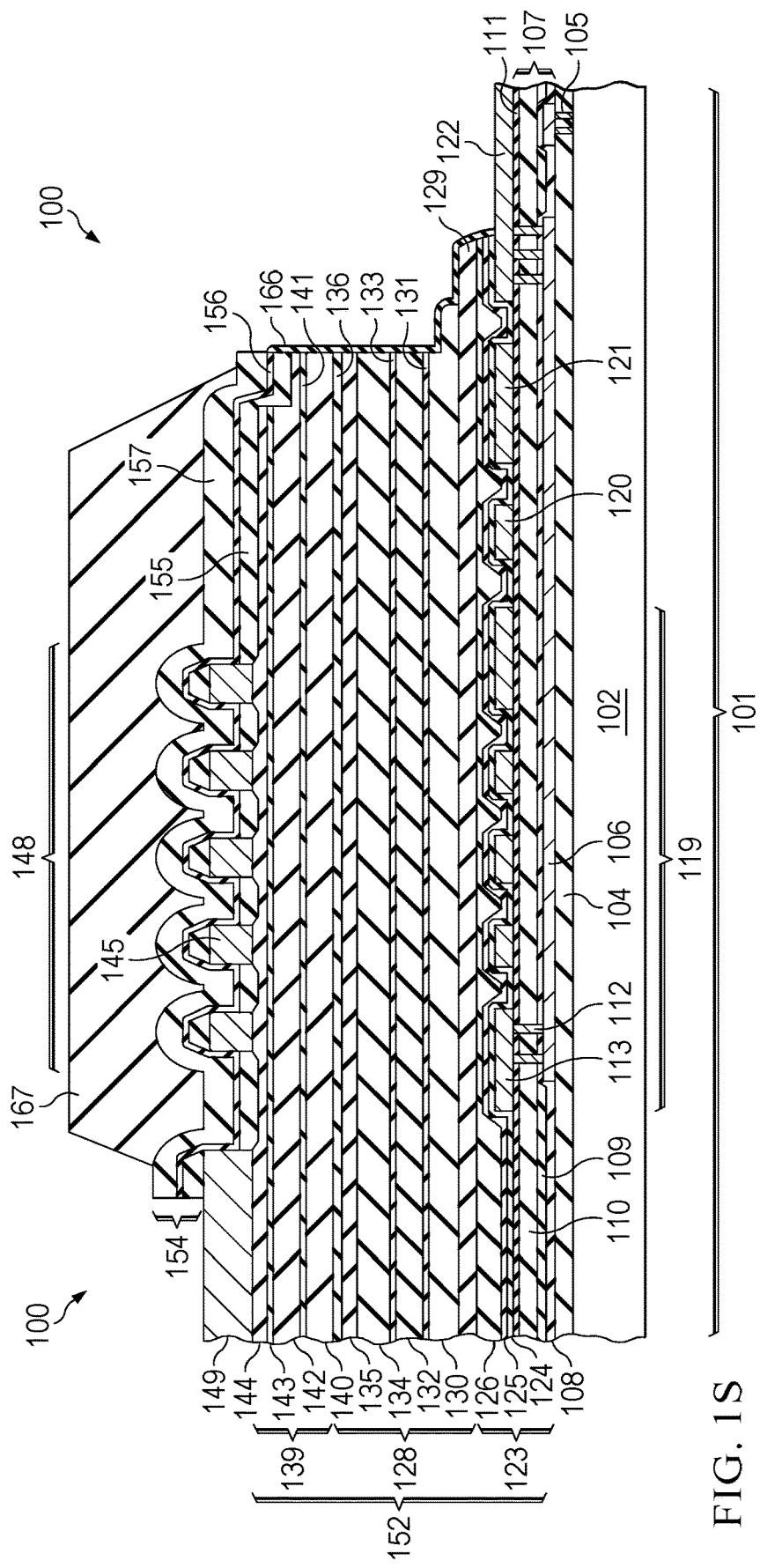

Referring to FIG. 1S, A second PO layer 167 of polymer material, such as polyimide, benzocyclobutene (BCB), or polybenzoxazole (PBO), may be formed on the PO inorganic dielectric stack 154. The second PO layer 167 is formed by a spin on process (not specifically shown) followed by a curing process (not specifically shown). A pattern and etch step are used to remove the second PO layer 167 over the upper bond pad 149 and the lower bond pad 122.

Figure 1T:
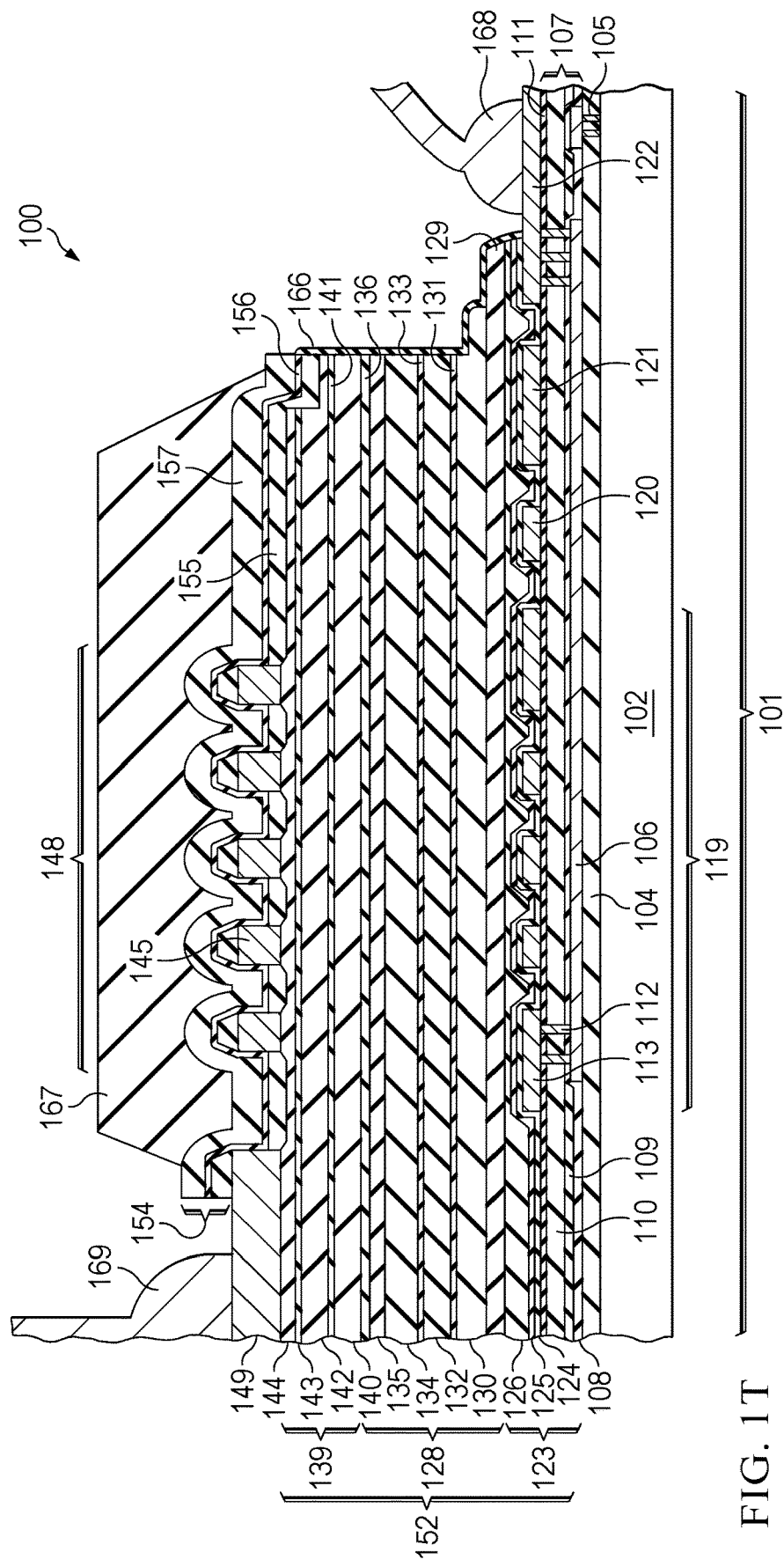

Referring to FIG. 1T, an upper level wire bond 169 is formed in electrical contact with the upper bond pad 149, and a lower level wire bond 168 is formed in electrical contact with the lower bond pad 122.

Figure 2:
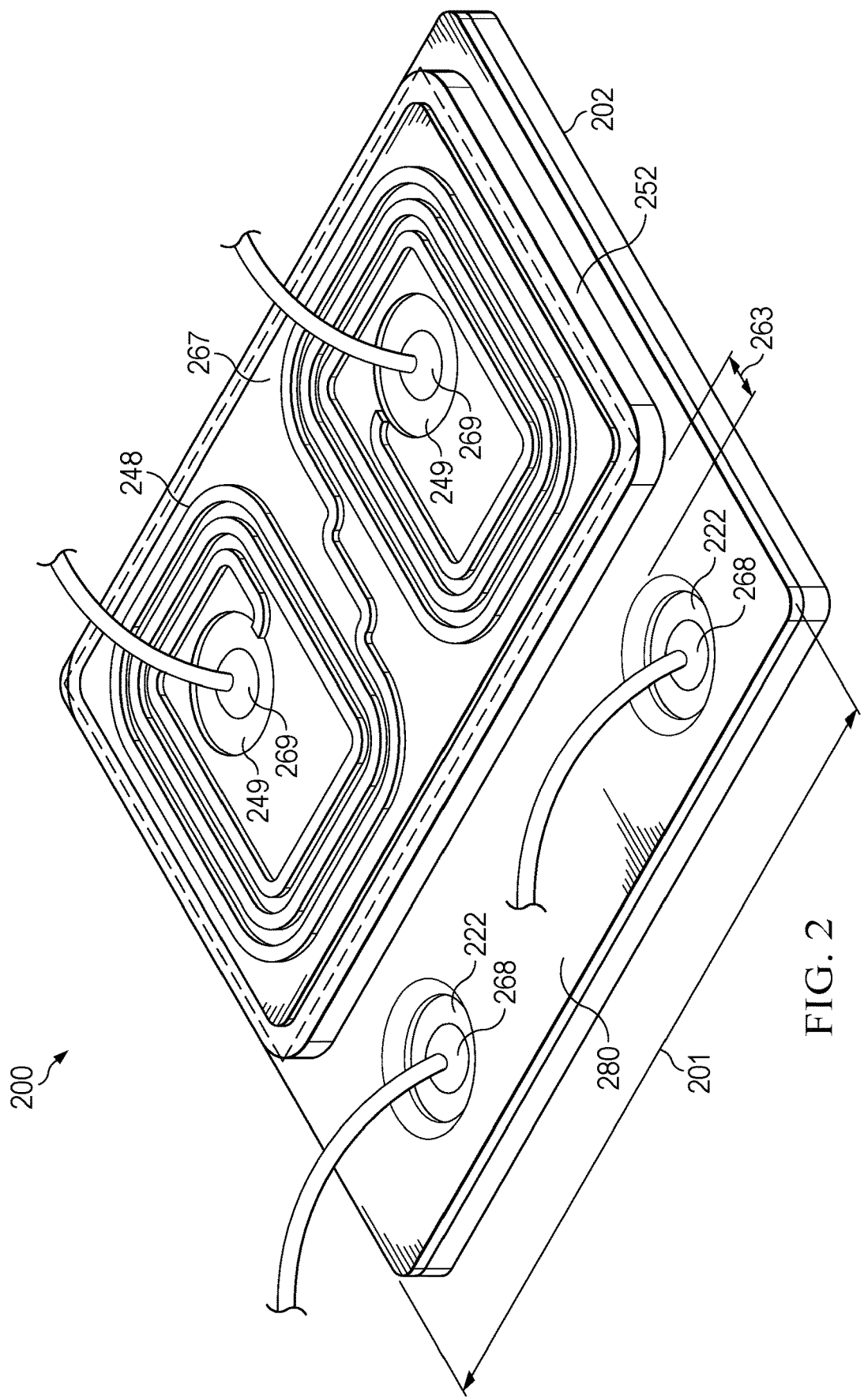
FIG. 2 shows a perspective view of the microelectronic device containing an isolation device.

Referring to FIG. 2, a perspective view of the microelectronic device 200 including the isolation device 201 is shown. Elements of the isolation device 201 visible in the perspective view include the substrate 202, the upper coil 248, the upper bond pad 249, the upper wire bond 269, the second PO layer 267, the lower bond pad 222, and the lower wire bond 268. The plateau 252 as well as the plateau oxide foot 280 and oxide foot space 263 are also visible in the perspective view.

What is claimed is:
1. A microelectronic device, comprising:
a substrate;
an inorganic dielectric on the substrate;
an isolation device including:
  a plateau on the inorganic dielectric, the plateau including:
    a lower dielectric stack on the inorganic dielectric including at least one low stress silicon dioxide layer, and at least one high stress silicon dioxide layer;
    a middle dielectric stack on the lower dielectric stack including a lower etch stop layer, and at least one layer of low stress silicon dioxide and at least one layer of high stress silicon dioxide over the lower etch stop layer;

an upper dielectric stack on the middle dielectric stack including at least one layer of low stress silicon dioxide, at least one layer of high stress silicon dioxide, at least one layer of silicon oxynitride, and at least one layer of silicon nitride; and
a lower isolation element in the lower dielectric stack;
an upper isolation element on the upper dielectric stack;
a dielectric protective overcoat on the upper isolation element;
an upper bond pad electrically connected to the upper isolation element; and
a lower bond pad electrically connected to the lower isolation element.

2. The microelectronic device of claim 1, wherein the isolation device includes a ground ring around the lower isolation element.

3. The microelectronic device of claim 1, wherein the isolation device includes filler metal.

4. The microelectronic device of claim 1, wherein the isolation device includes a photolithographic alignment mark in the plateau.

5. The microelectronic device of claim 1, wherein the lower dielectric stack includes a bilayer of silicon oxynitride and silicon nitride on the lower isolation element.

6. The microelectronic device of claim 1, wherein the lower dielectric stack includes a layer of gap filling silicon dioxide and a layer of low stress silicon dioxide.

7. The microelectronic device of claim 1, wherein the lower etch stop layer of the middle dielectric stack is silicon nitride.

8. The microelectronic device of claim 1, further including an upper etch stop layer in the middle dielectric stack over the lower etch stop layer.

9. The microelectronic device of claim 8, wherein the upper etch stop layer of the middle dielectric stack is silicon nitride.

10. The microelectronic device of claim 1, wherein:
the isolation device includes a transformer;
the lower isolation element includes a first coil of the transformer; and
the upper isolation element includes a second coil of the transformer.

11. The microelectronic device of claim 1, wherein the high stress and the low stress are compressive stresses.

12. The microelectronic device of claim 1, wherein:
the upper bond pad and the upper isolation element are patterned from a same metallization layer; and
the lower bond pad and the lower isolation element are patterned from a same metallization layer.

13. The microelectronic device of claim 1, wherein the lower bond pad is disposed adjacent to the plateau.

14. A microelectronic device, comprising:
a substrate;
an isolation device disposed on the substrate, the isolation device including:
a plurality of dielectric layers which includes:
a first stack of dielectric layers disposed on the substrate and including at least a first dielectric layer having a first stress and a second dielectric layer having a second stress which is greater than the first stress;
a second stack of dielectric layers disposed on the first stack of dielectric layers and including at least a third dielectric layer having a third stress and a fourth dielectric layer having a fourth stress which is greater than the third stress; and
a third stack of dielectric layers disposed on the second stack of dielectric layers and including a fifth dielectric layer having a fifth stress, a sixth dielectric layer having a sixth stress which is greater than the fifth stress, a layer of silicon oxynitride, and a layer of silicon nitride;
a first isolation element disposed within the first stack of dielectric layers; and
a second isolation element disposed on the third stack of dielectric layers;
a first bond pad electrically connected to the first isolation element; and
a second bond pad electrically connected to the second isolation element.

15. The microelectronic device of claim 14, wherein the first, second, third, fourth, fifth, and sixth stresses are compressive stresses.

16. The microelectronic device of claim 14, wherein the first, second, third, fourth, fifth and sixth dielectric layers include alternating layers of high stress and low stress silicon dioxide.

17. The microelectronic device of claim 14, wherein:
the first bond pad and the first isolation element are patterned from a same metallization layer; and
the second bond pad and the second isolation element are patterned from a same metallization layer.

18. The microelectronic device of claim 14, wherein:
the isolation device includes a transformer;
the first isolation element includes a first coil of the transformer; and
the second isolation element includes a second coil of the transformer.

19. A microelectronic device, comprising:
an isolation device disposed on a substrate, the isolation device including:
a first isolation element;
a second isolation element; and
a stack of dielectric layers disposed between the first and second isolation elements, the stack of dielectric layers including: alternating layers of high stress and low stress silicon dioxide; and
a layer of silicon oxynitride and a layer of silicon nitride disposed over the alternating layers of high stress and low stress silicon dioxide;
a first bond pad electrically connected to the first isolation element; and
a second bond pad electrically connected to the second isolation element.

20. The microelectronic device of claim 19, wherein:
the isolation device includes a transformer;
the first isolation element includes a first coil of the transformer; and
the second isolation element includes a second coil of the transformer.

21. The microelectronic device of claim 19, wherein:
the first bond pad and the first isolation element are patterned from a same metallization layer; and
the second bond pad and the second isolation element are patterned from a same metallization layer.

* * * * *